(12) United States Patent
Ripley et al.

(10) Patent No.: US 8,774,739 B2
(45) Date of Patent: Jul. 8, 2014

(54) MULTI-MODE POWER SUPPLY REGULATOR FOR POWER AMPLIFIER CONTROL

(75) Inventors: David S. Ripley, Marion, IA (US); James P. Young, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/571,291

(22) Filed: Aug. 9, 2012

(65) Prior Publication Data

US 2013/0059554 A1  Mar. 7, 2013

Related U.S. Application Data

(63) Continuation of application No. PCT/US2010/023741, filed on Feb. 10, 2010.

(51) Int. Cl.
*H01Q 11/12* (2006.01)
*H04B 1/04* (2006.01)

(52) U.S. Cl.
USPC ........................................ 455/127.1; 330/296

(58) Field of Classification Search
USPC .................... 455/127.1; 330/127, 296, 297
See application file for complete search history.

(56) References Cited

U.S. PATENT DOCUMENTS

| | | | |
|---|---|---|---|
| 6,897,730 B2 * | 5/2005 | Dupuis et al. | 330/297 |
| 7,342,387 B1 * | 3/2008 | Li | 323/282 |
| 2002/0024388 A1 | 2/2002 | Nitta | |
| 2005/0064830 A1 | 3/2005 | Grigore | |
| 2006/0128325 A1 | 6/2006 | Levesque et al. | |
| 2006/0293002 A1 | 12/2006 | McCune | |
| 2007/0111686 A1 | 5/2007 | Lee | |
| 2009/0191826 A1 | 7/2009 | Takinami et al. | |
| 2009/0237055 A1 * | 9/2009 | Sakai et al. | 323/284 |

OTHER PUBLICATIONS

International Preliminary Report on Patentability dated Oct. 26, 2010 for Application No. PCT/US2010/023741 filed Feb. 10, 2010, 7 pages.

* cited by examiner

*Primary Examiner* — Lee Nguyen
(74) *Attorney, Agent, or Firm* — Knobbe, Martens, Olson & Bear, LLP

(57) ABSTRACT

A radio frequency (RF) power amplification system in which a combination of a linear voltage regulator having a PFET pass device and a DC-DC converter having an NFET pass device is used to supply power to an RF power amplifier. The RF power amplifier receives power from either the linear voltage regular and its associated PFET pass device or the DC-DC converter and its NFET pass device, depending upon the condition of a mode signal.

23 Claims, 9 Drawing Sheets

MULTI-MODE POWER SUPPLY REGULATOR FOR POWER AMPLIFIER CONTROL

CROSS-REFERENCE TO RELATED APPLICATIONS

This application is a continuation of International Application No. PCT/US2010/023741, filed Feb. 10, 2010, the benefit of the filing date of which is hereby claimed and the specification of which is incorporated herein by this reference.

BACKGROUND

Providing a power supply in a cellular telephone (also referred to as a handset) or similar mobile wireless telecommunication device can be challenging. Goals such as minimizing power consumption may compete with others, such as minimizing adverse effects on the radio frequency (RF) spectrum of the transmitter power amplifier. Power supply challenges can be particularly acute in multi-mode devices, such as those that operate in accordance with a selected one of two or more different transmission standards, such as the Code Division Multiple Access (CDMA) standard, the Enhanced Data Rates for GSM Evolution (EDGE) standard, or the General Packet Radio Service (GPRS) standard.

In some RF power amplifier systems, such as those having a Collector Voltage Amplifier Control (COVAC) architecture, the power amplifier power supply includes a linear voltage regulator. The output of an error amplifier within the linear voltage regulator is connected to a control input of a pass device, such as the gate of a field-effect transistor (FET), which acts as a variable resistance between the power supply and the power amplifier. A p-channel FET (PFET), rather than an n-channel FET (NFET), is commonly employed as the pass device, because at low power supply voltages an NFET will not operate unless its gate voltage could be boosted higher than the power supply voltage when the desired regulator output voltage is close to (typically less than one volt) the power supply voltage. Providing the boosted gate voltage is generally not feasible in a battery-operated device such as a mobile wireless telecommunication device.

In other RF power amplifier systems, the RF power amplifier is directly connected to the battery. However, as it has been recognized that under normal usage conditions such devices do not transmit, on average, at peak power, many of today's RF power amplifier systems include a DC-DC converter between the battery and the power amplifier to step the battery voltage down to a level that economizes on power consumption yet still permits operation under essentially all normal usage conditions. However, including a conventional DC-DC converter in some wireless telecommunication devices can present problems. For example, because DC-DC converters are based upon switching circuitry, they can introduce spurious signals into the power supply at the switching frequencies unless measures are taken to isolate sensitive elements, such as the power amplifier. Also, many conventional DC-DC converters include a large inductor external to the power supply chip, which can take up an undesirably large amount of space. Inductor-less DC-DC converters have been developed, in which capacitors are used as the energy storage elements instead of inductors.

It has been suggested to use inductor-less DC-DC converters to supply wireless telecommunication device power amplifiers. Such DC-DC converters have been successfully employed in some CDMA wireless telecommunication devices because the power amplifiers in such devices inherently provide 20-30 dB supply rejection, since the power amplifier is not voltage saturated. (The term "supply rejection" or "power supply rejection" in this context refers to the ratio of signal content present on the power supply relative to the signal content modulated onto the RF carrier.) Additionally, in a CDMA transmitter the DC-DC converter switching frequency spectrum can often be hidden in-band with limited impact to power amplifier performance.

Integrating a DC-DC converter into a multi-mode device, such as one that operates in accordance with both the GPRS and EDGE standards, presents greater challenges. For example, the Third-Generation Partnership Project (3GPP) standard for GPRS requires that power amplifier output power be controllable over a 35 dB dynamic range and includes spectrum specifications that require significant power amplifier isolation at frequencies near the DC-DC converter switching frequencies. It has been recognized that employing a DC-DC converter in a GPRS device power amplifier power supply would require a large linear voltage regulator in series with the DC-DC converter to provide the required frequency rejection in the DC-DC converter, since the frequencies of the spurious switching signals often fall outside the transmit channel. However, a series combination of a switching DC-DC converter plus a linear voltage regulator would unavoidably degrade the peak power performance of the power amplifier. Also, as a PFET pass device would be used with such a linear voltage regulator, providing sufficient voltage regulator frequency rejection while supporting peak power operation would be problematic. The use of a PFET pass device in a GPRS device power amplifier power supply having a series combination of a DC-DC converter and a linear regulator would also limit the minimum DC-DC converter output voltage, due to the gate-to-source voltage requirement of such a PFET device.

SUMMARY

Embodiments of the invention relate to a radio frequency (RF) power amplification system in which a combination of a linear voltage regulator having a PFET pass device and a DC-DC converter having an NFET pass device is used to supply power to an RF power amplifier. Embodiments of the invention can include this combination in a Collector Voltage Amplifier Control (COVAC) system to provide closed-loop power control. A mode signal that indicates one of a first mode and a second mode is used to activate one of a first regulator system and a second regulator system, where the first regulator system comprises the linear voltage regulator and the PFET pass device, and the second regulator system comprises the DC-DC converter and the NFET pass device. The RF power amplifier receives power from the activated one of the first and second regulator systems.

Other systems, methods, features, and advantages of the invention will be or become apparent to one with skill in the art upon examination of the following figures and detailed description.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
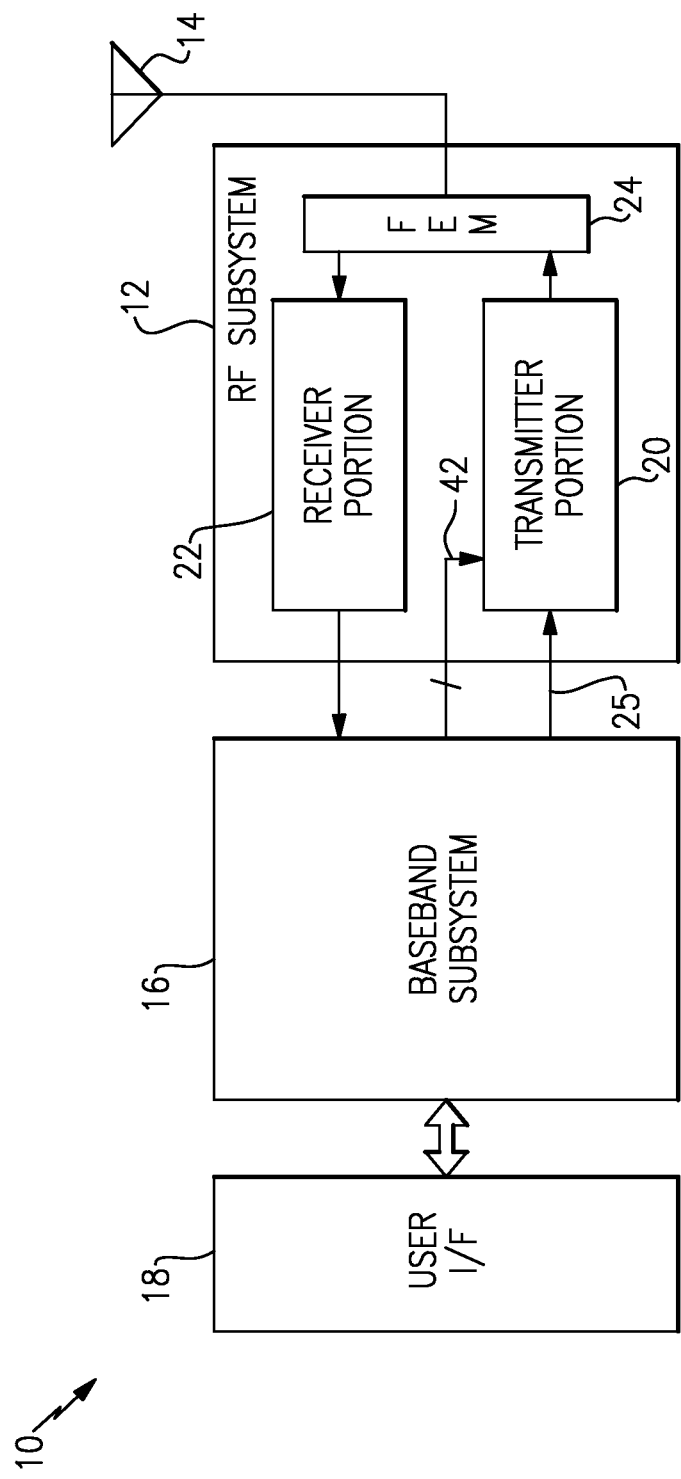
FIG. 1 is a block diagram of a mobile wireless telecommunication device in accordance with an exemplary embodiment of the invention.

As illustrated in FIG. 1, in an illustrative or exemplary embodiment of the invention, a mobile wireless telecommunication device 10, such as a cellular telephone handset, includes a radio frequency (RF) subsystem 12, an antenna 14, a baseband subsystem 16, and a user interface section 18. Mobile wireless telecommunication device 10 is of a multi-mode (e.g., dual-mode) type. The RF subsystem 12 includes a transmitter portion 20 and a receiver portion 22. The output of transmitter portion 20 and the input of receiver portion 22 are coupled to antenna 14 via a front-end module 24 that allows simultaneous passage of both the transmitted RF signal produced by transmitter portion 20 and the received RF signal that is provided to receiver portion 22. But for certain elements of transmitter portion 20 described below, the above-listed elements can be of types conventionally included in such mobile wireless telecommunication devices. As conventional elements, they are well understood by persons of ordinary skill in the art to which the present invention relates and, accordingly, not described in further detail herein. However, unlike conventional transmitter portions of such mobile wireless telecommunication devices, transmitter portion 20 includes a power amplifier (PA) system 30 (FIG. 2) having the power supply regulator features described below.

Figure 2:
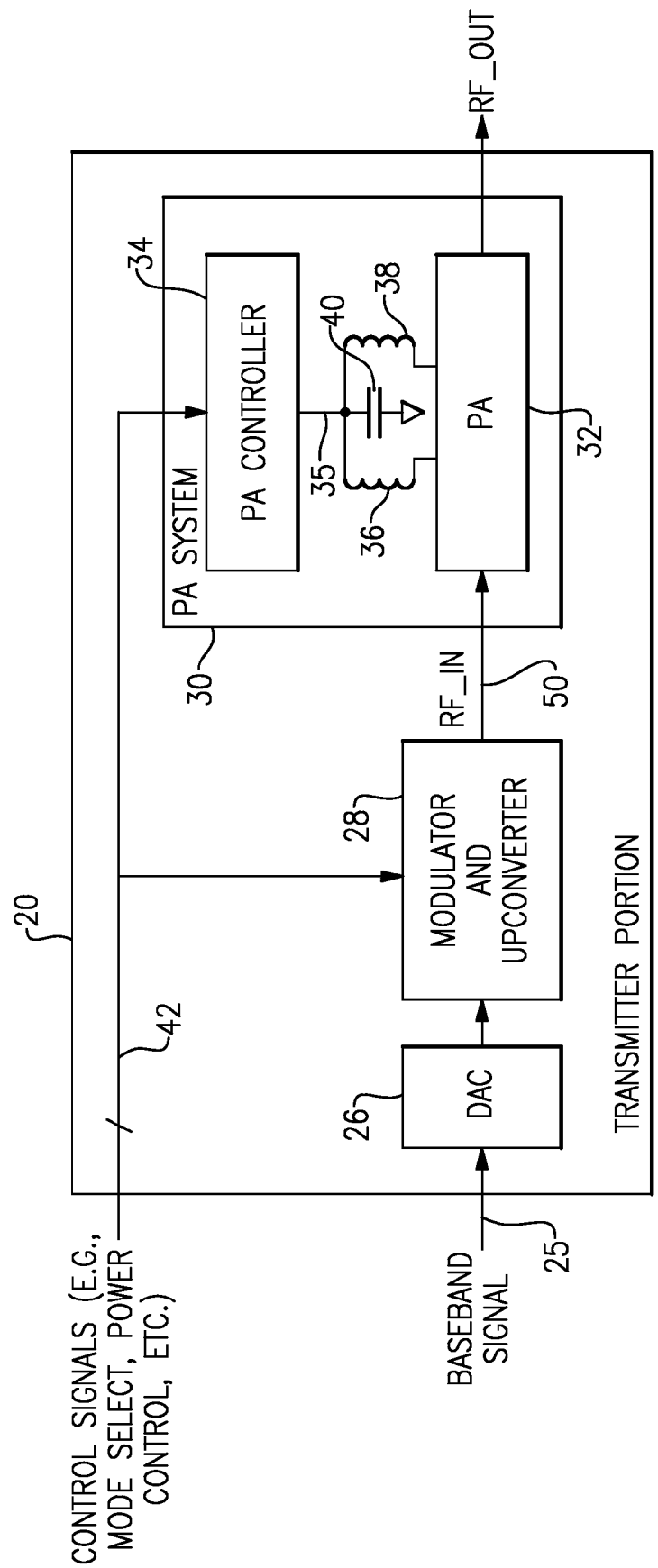
FIG. 2 is a block diagram of the transmitter portion of the device of FIG. 1.

As illustrated in FIG. 2, transmitter portion 20 receives as an input a digital baseband signal 25 from baseband subsystem 16 (FIG. 1) and outputs an RF signal to be transmitted. Transmitter portion 20 further includes a digital-to-analog converter 26, and a dual-mode modulator and upconversion mixer 28. Digital-to-analog converter 26 converts the digital baseband signal to analog form and provides the resulting analog baseband signal to dual-mode modulator and upconversion mixer 28. The output of dual-mode modulator and upconversion mixer 28 is provided to power amplifier system 30. Power amplifier system 30 includes a power amplifier 32 and a power amplifier controller 34. Power amplifier controller 34 provides a control signal on connection 35 to power amplifier 32, which power amplifier 32 receives via two inductors 36 and 38 and a capacitor 40.

As well understood by persons skilled in the art, baseband subsystem 16 (FIG. 1), through an internal microprocessor system or similar logic (not separately shown), can control various operational aspects of mobile wireless telecommunication device 10. For example, baseband subsystem 16 can cause one or more transmitter control signals to be provided on one or more connections 42 that affect the operation of transmitter portion 20. Transmitter control signals can include, for example, a transmitter modulation mode signal and a transmitter power control signal.

In the exemplary embodiment, a transmitter modulation mode signal can instruct dual-mode modulator and upconversion mixer 28 and power amplifier system 30 to operate in a selected one of two modulation modes, which can also be referred to as power amplifier modes. As well understood in the art, multi-mode (e.g., dual-mode) cellular handsets enable roaming between geographic regions in which cellular telecommunication standards differ. Although in other embodiments there can be more than two modes, in this exemplary embodiment the modulation modes can be EDGE and GPRS. As well understood in the art, in response to a transmitter modulation mode signal representing a command or instruction issued by baseband subsystem 16 to operate in EDGE mode, transmitter portion 20 modulates the signal to be transmitted in accordance with the EDGE standard. Likewise, in response to a transmitter modulation mode signal representing a command or instruction issued by baseband subsystem 16 to operate in GPRS mode, transmitter portion 20 modulates the signal to be transmitted in accordance with the GPRS standard.

The transmitter power control signal indicates the output power at which transmitter portion 20 is instructed to operate. For example, it is known to instruct a transmitter operating in EDGE mode to further operate in a selected one of a high-power EDGE mode and a low-power EDGE mode. It is also known to instruct a transmitter to operate in a selected one of a high-power GPRS mode and a low-power GPRS mode. More specifically, baseband subsystem 16 can issue a power control command that instructs power amplifier system 30 to set its gain to a selected value and thus amplify its RF input signal 50 to a corresponding high or low transmission power level. Although only two levels are described herein in connection with the exemplary embodiment, in other embodiments there can be any number of power levels at which a transmitter can be instructed to operate.

Figure 3:
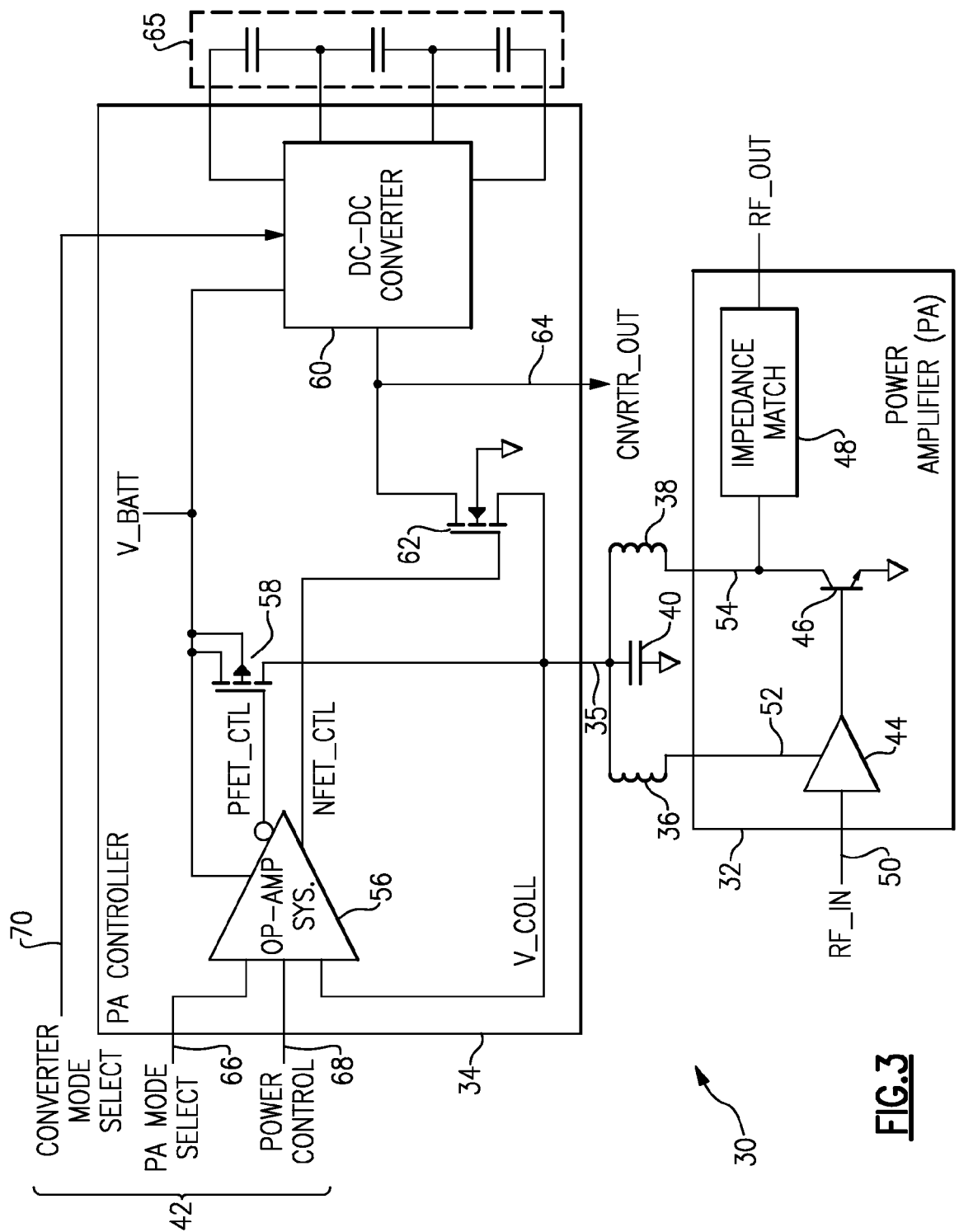
FIG. 3 is a block diagram of the power amplifier and power amplifier controller of the transmitter portion of FIG. 2.

As illustrated in FIG. 3, power amplifier 32 includes a driver stage 44, an output stage 46, and an impedance match circuit 48. Driver stage 44 can comprise, for example, an operational amplifier (op-amp), transistor circuitry, etc. Driver stage 44 of power amplifier 32 receives RF input signal 50 and amplifies it in response to an amplification control signal or bias signal provided on connection 52. Output stage 46 receives the amplified signal and further amplifies it in response to an amplification control signal or bias signal provided on connection 54. Output stage 46 can comprise, for example, a bipolar junction transistor, with connection 54 providing the amplification control signal to the collector terminal of the transistor in a manner similar to that which is commonly referred to as Collector Voltage Amplifier Control (COVAC). The structure and constituent elements of power amplifier 32 shown in FIG. 3 are intended only to be illustrative or exemplary, and in other embodiments the power amplifier can include different elements arranged in other ways. It should be noted that the amplification control signals provided on connections 52 and 54 not only control the extent of amplification, i.e., gain, but also effectively supply regulated power to driver stage 44 and output stage 46. Power amplifier controller 34 regulates such power in the following manner.

As further illustrated in FIG. 3, power amplifier controller 34 includes an op-amp system 56, a PFET pass device 58 that is controlled by a first output (PFET_CTL) of op-amp system 56, a DC-DC converter 60, and an NFET pass device 62 that is controlled by a second output (NFET_CTL) of op-amp system 56. The PFET pass device 58 has a source terminal coupled to the battery voltage signal (V_BATT), and a drain terminal coupled to connection 35. The signal on connection 35 is labeled V_COLL to denote the above-described "COVAC" collector voltage control of output stage 46 of power amplifier 32. The NFET pass device 62 has a source terminal coupled to the output 64 (CNVRTR_OUT) of DC-DC converter 60 and a drain terminal coupled to connection 35. A capacitor network 65 is connected to DC-DC converter 60 in a conventional manner.

Op-amp system 56, which is described in further detail below, has characteristics of an op-amp but also includes additional circuitry. The op-amp function of op-amp system 56 provides linear voltage regulation, as described in further detail below. Op-amp system 56 receives some of the above-referenced control signals 42: a mode select signal 66, and an analog power control signal 68. Another one of control signals 42, a converter mode select signal 70, is received by DC-DC converter 60.

Figure 4:
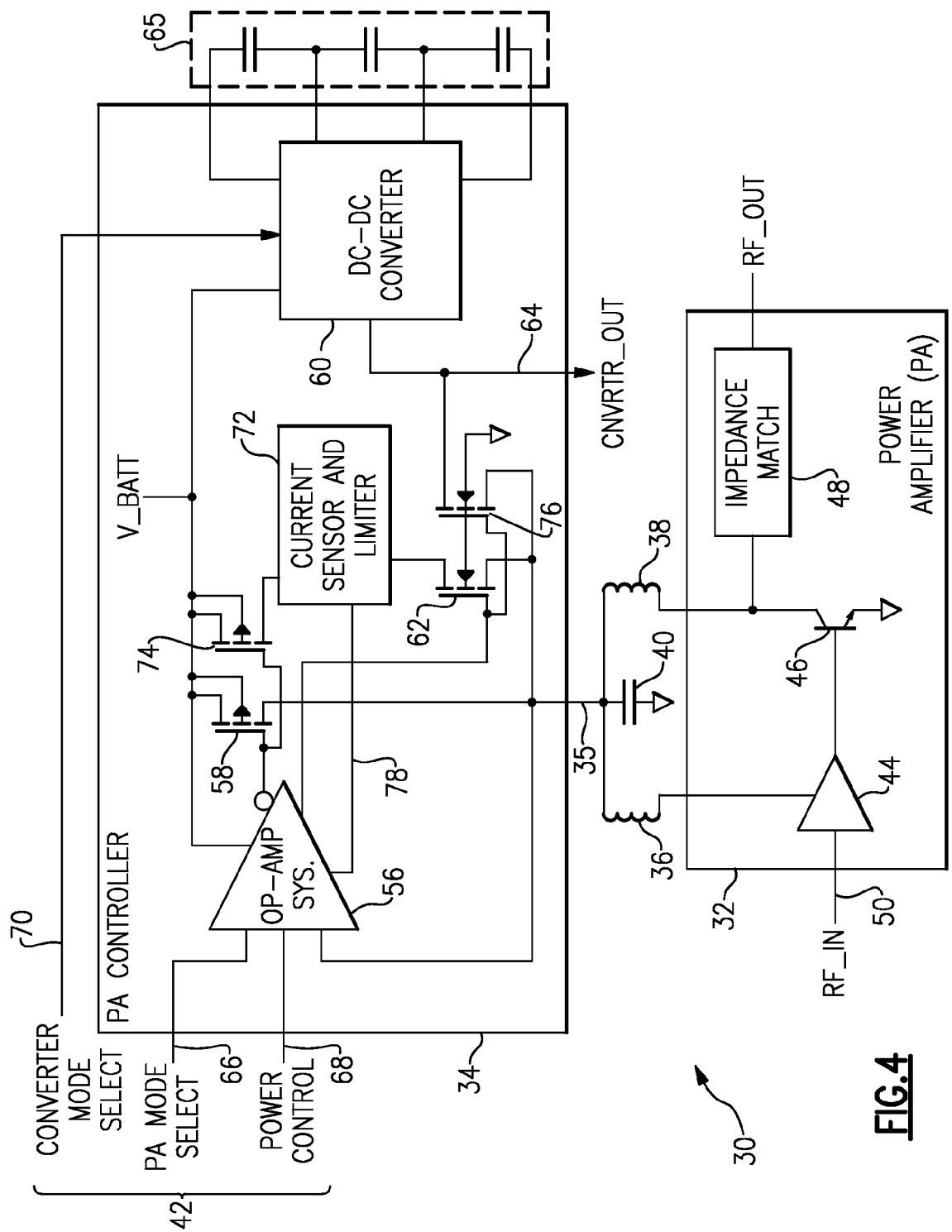
FIG. 4 is similar to FIG. 3, showing an alternative embodiment that further includes current sensing features.

As illustrated in FIG. 4, power amplifier controller 34 can further include a current sensor and limiter circuit 72, an additional PFET 74 that senses the current in PFET pass device 58, and an additional NFET 76 that senses the current in NFET pass device 62. Through additional PFET 74 and additional NFET 76, current sensor and limiter circuit 72 can determine if the current in one or both of PFET pass device 58 and NFET pass device 62 exceeds a threshold, and provide a signal to op-amp system 56 on a connection 78 to indicate such an over-current condition. Op-amp system 56 can respond to the over-current indication by causing PFET pass device 58 and NFET pass device 62 to limit the current that they provide to power amplifier 32 on connection 35. Suitable circuitry that can be included in current sensor and limiter circuit 72 and op-amp system 56 for this purpose is described in U.S. Pat. No. 7,193,474, which is incorporated herein by reference. However, in other embodiments op-amp system 56 can include any other type of additional circuitry that can benefit from receiving an indication of the current sensed in PFET pass device 58 and NFET pass device 62. An example of such circuitry is the open-loop power control circuitry described in U.S. Pat. No. 7,408,413, which is also incorporated herein by reference.

Figure 5:
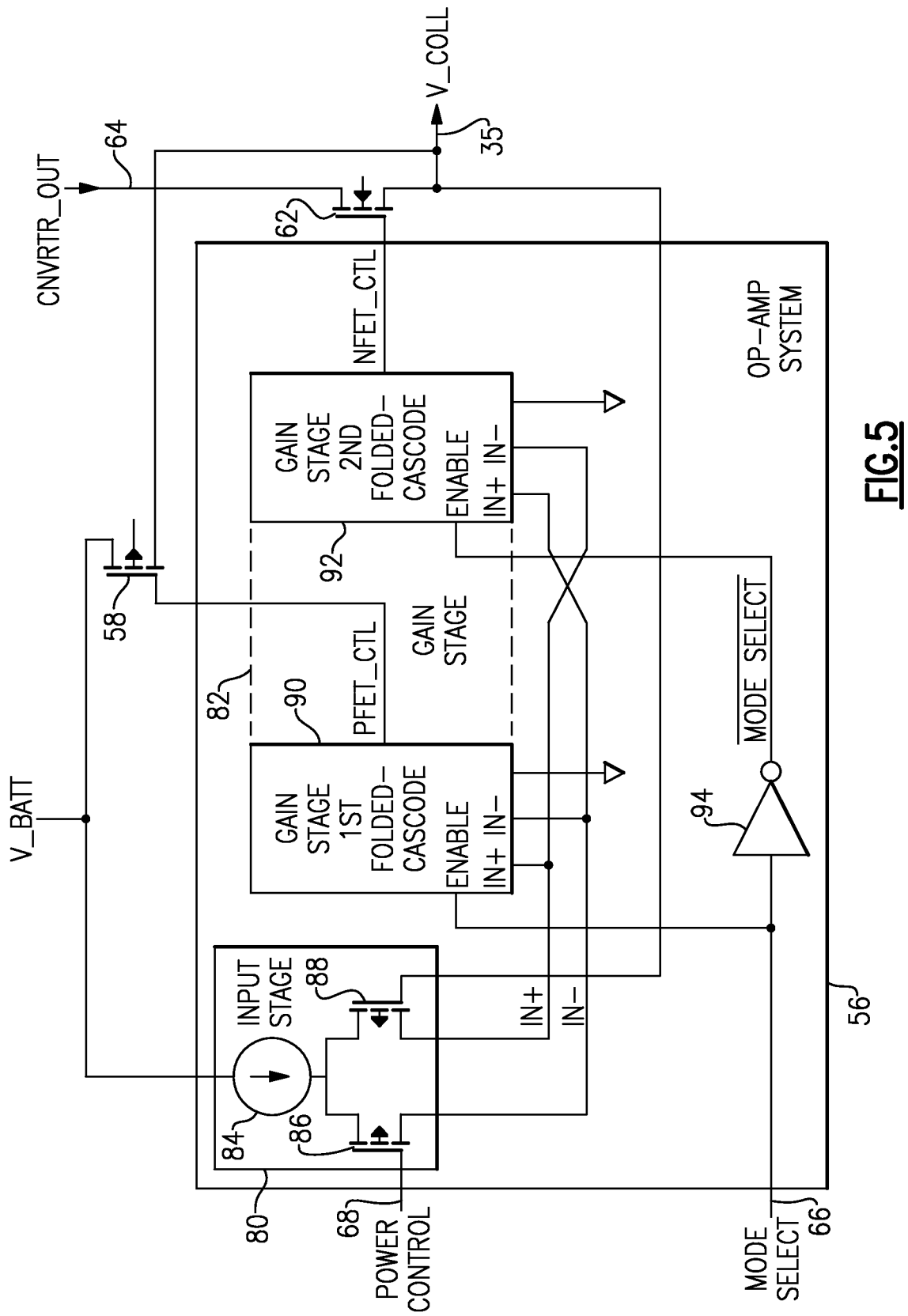
FIG. 5 is a block diagram showing the op-amp system of the power amplifier controller of FIG. 3 in further detail.

Op-amp system 56 is illustrated in FIG. 5 along with PFET pass device 58 and NFET pass device 62. Op-amp system 56 includes an input stage 80 and a gain stage 82 that together provide linear voltage regulation. Input stage 80 includes a current source 84 and two PFETs 86 and 88 that form a differential input pair. The power amplifier collector voltage (V_COLL) on connection 35 provides feedback to input stage 80 to aid in the linear voltage regulation. This feedback signal may also include additional circuitry (not shown) acting on V_COLL, such as a resistive voltage divider to adjust the linear voltage regulation gain. Input stage 80 receives the above-described power control signal 68 and transforms it into a differential input signal (IN+, IN−). Gain stage 82 is defined by a folded-cascode circuit comprising a first folded-cascode 90 and a second folded-cascode 92, which are described below in further detail. First folded-cascode 90 generates the PFET_CTL output that controls PFET pass device 58. Second folded-cascode 92 generates the NFET_CTL output that controls NFET pass device 62.

Each of first folded-cascode 90 and second folded-cascode 92 receives the differential input signal (IN+, IN−) as well as an Enable signal related to mode select signal 66. The differential input signal and Enable signal received by first folded-cascode 90 are shown as being of opposite polarities from the differential input signal and Enable signal received by second folded-cascode 92 (note inversion 94 and crossing of differential input signal lines) to indicate that one of first folded-cascode 90 and second folded-cascode 92 is active while the other is inactive. This polarity inversion compensates for the 180 degree gain difference resulting from the use of PFET pass device 58 versus NFET pass device 62.

Figure 6:
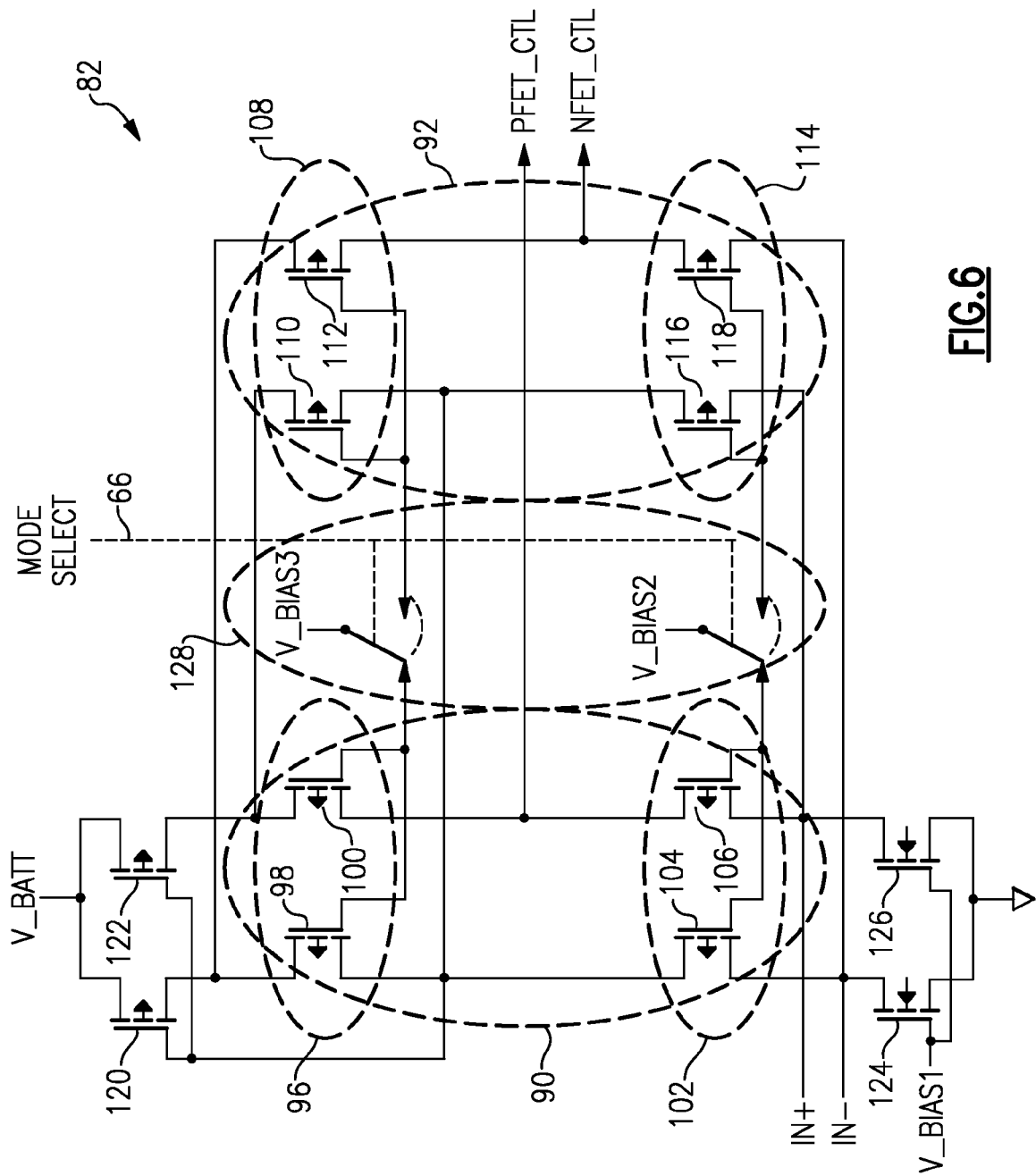
FIG. 6 is a circuit diagram showing exemplary circuitry in the gain stage of the op-amp system of FIG. 5.

As illustrated in FIG. 6, gain stage 82 can be implemented or embodied in a manner that minimizes component redundancy. For example, first folded cascode 90 can be implemented using a first cascode pair 96, comprising two PFETs 98 and 100, and a second cascode pair 102, comprising two PFETs 104 and 106. Similarly, second folded cascode 92 can be implemented using another first cascode pair 108, comprising two PFETs 110 and 112, and another second cascode pair 114, comprising two PFETs 116 and 118. A common current mirror pair of PFETs 120 and 122 acts to source current from the battery voltage signal (V_BATT) to the cascade circuitry. A first bias voltage (V_BIAS1) is used to bias the common current sources formed through two NFETs 124 and 126. Control circuitry 128 responds to mode select signal 66 by coupling or switching a second bias voltage (V_BIAS2) to a selected one (as indicated by mode select signal 66) of second cascode pair 102 and second cascode pair 114. Similarly, control circuitry 128 responds to mode select signal 66 by coupling or switching a third bias voltage (V_BIAS3) to a selected one (as indicated by mode select signal 66) of first cascode pair 96 and first cascode pair 108. Although for purposes of illustration the above-described FIG. 5 shows mode select signal 66 applied to the Enable input of first folded cascode 90 and a complement of the mode select signal applied to the Enable input of second folded cascode 92 via a conceptual inversion 94, FIG. 6 shows that a physical inverter element may not be necessary so long as control circuitry 128 is configured to perform the switching in the manner described herein in response to mode select signal 66. The first, second and third bias voltages are simply signals having fixed voltages and can be generated by any suitable circuitry (not shown for purposes of clarity). Control circuitry 128 can be implemented or embodied in any suitable manner, such as using NFETs for V_BIAS2 and PFETs for V_BIAS3 to perform the above-described switching.

As well understood by persons skilled in the art, the term "cascode circuit" refers to a circuit having an active device (or cascode device) configured in a common-gate configuration in the signal path of an amplifying transistor. A conventional cascode device isolates a terminal (e.g., the drain) of the amplifying device from the voltage variation of the output signal and supply voltage and acts to increase the output impedance of the cascode circuit. Since in a conventional circuit arrangement the cascode device is in series with the amplifying device, the cascode device impedes the maximum voltage swing that can be achieved at the output. However, the "folded" cascode circuit described above in accordance with an embodiment of the present invention provides the benefits of a cascode while allowing the full voltage swing by "folding" the signal path against the battery voltage signal.

Figure 7:
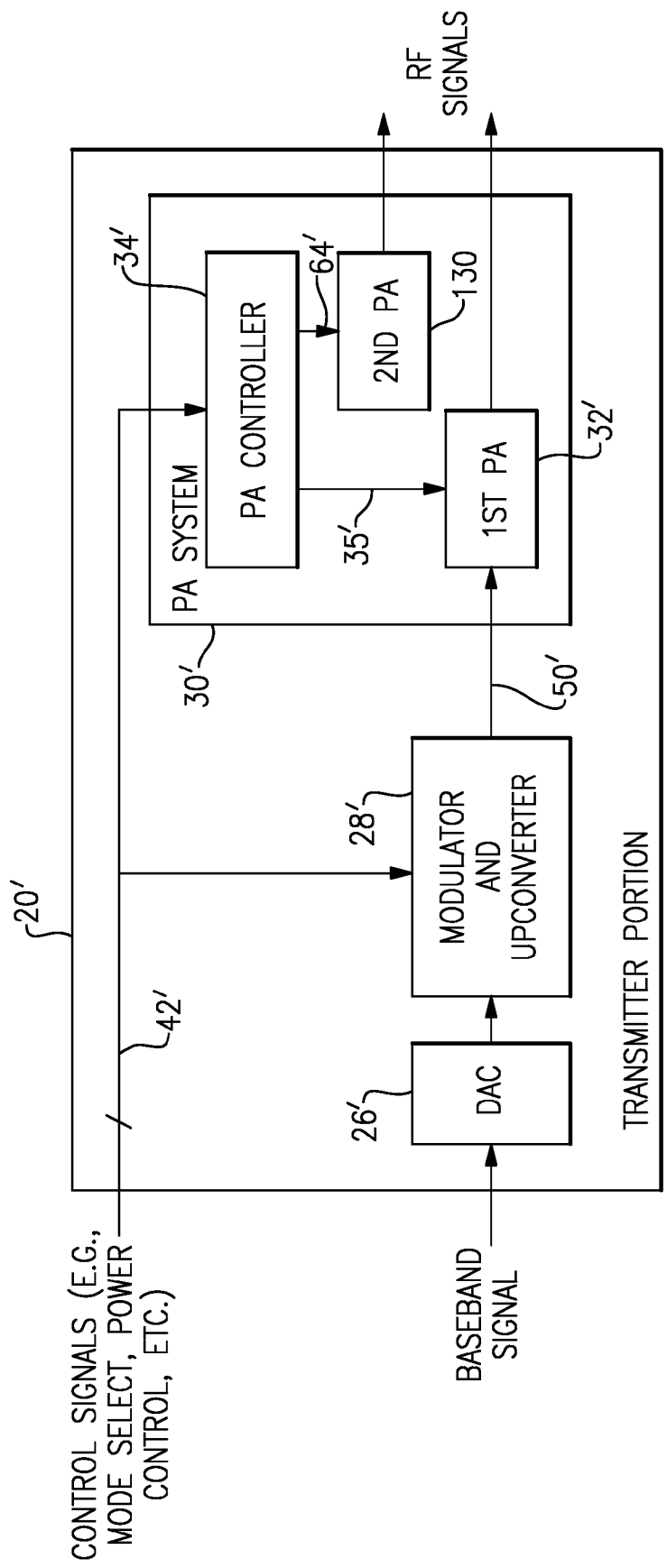
FIG. 7 is a block diagram of a transmitter portion of a mobile wireless telecommunication device in accordance with another exemplary embodiment of the invention.

As illustrated in FIG. 7, in an embodiment similar to that described above with regard to FIG. 2, the DC-DC converter output signal 64' (see FIGS. 3-4) can be used by other circuitry within the transmitter 20', such as a second power amplifier 130. Other than this feature, the embodiment shown in FIG. 7 is identical to that shown in FIG. 2 and described above. (Coupling circuitry between power amplifier controller 34 and first power amplifier and between power amplifier controller 34 and second power amplifier can be included as in the embodiment shown in FIG. 2 but is not shown in FIG. 7 for purposes of clarity.)

In accordance with another feature, and referring again to FIGS. 3-4, DC-DC converter 60 can respond to the converter mode select signal 70 by adjusting its output signal. DC-DC converters that include an adjustment or mode input are known. Such a DC-DC converter 60 can receive converter mode select signal 70 from baseband subsystem 16 as one of control signals 42. Baseband subsystem 16 can set or adjust converter mode signal 70 to cause DC-DC converter 60 to adjust its output signal. For example, DC-DC converter 60 can cause its output signal to be, for example, equal to the battery voltage (V_BATT), ⅔ of the battery voltage, ½ of the battery voltage, or ⅓ of the battery voltage. Using this feature, baseband subsystem 16 can cause DC-DC converter 60 to adjust its output signal upwards if baseband subsystem 16 detects a decrease in battery voltage. For example: if baseband subsystem 16 detects a battery voltage above about 4.0 volts, baseband subsystem 16 can cause DC-DC converter 60 to set its output to ½ of the battery voltage; if baseband subsystem 16 detects a battery voltage lower than about 4.0 volts, indicating that the battery has discharged somewhat, baseband subsystem 16 can cause DC-DC converter 60 to set its output to ⅔ of the battery voltage.

Figure 8A:
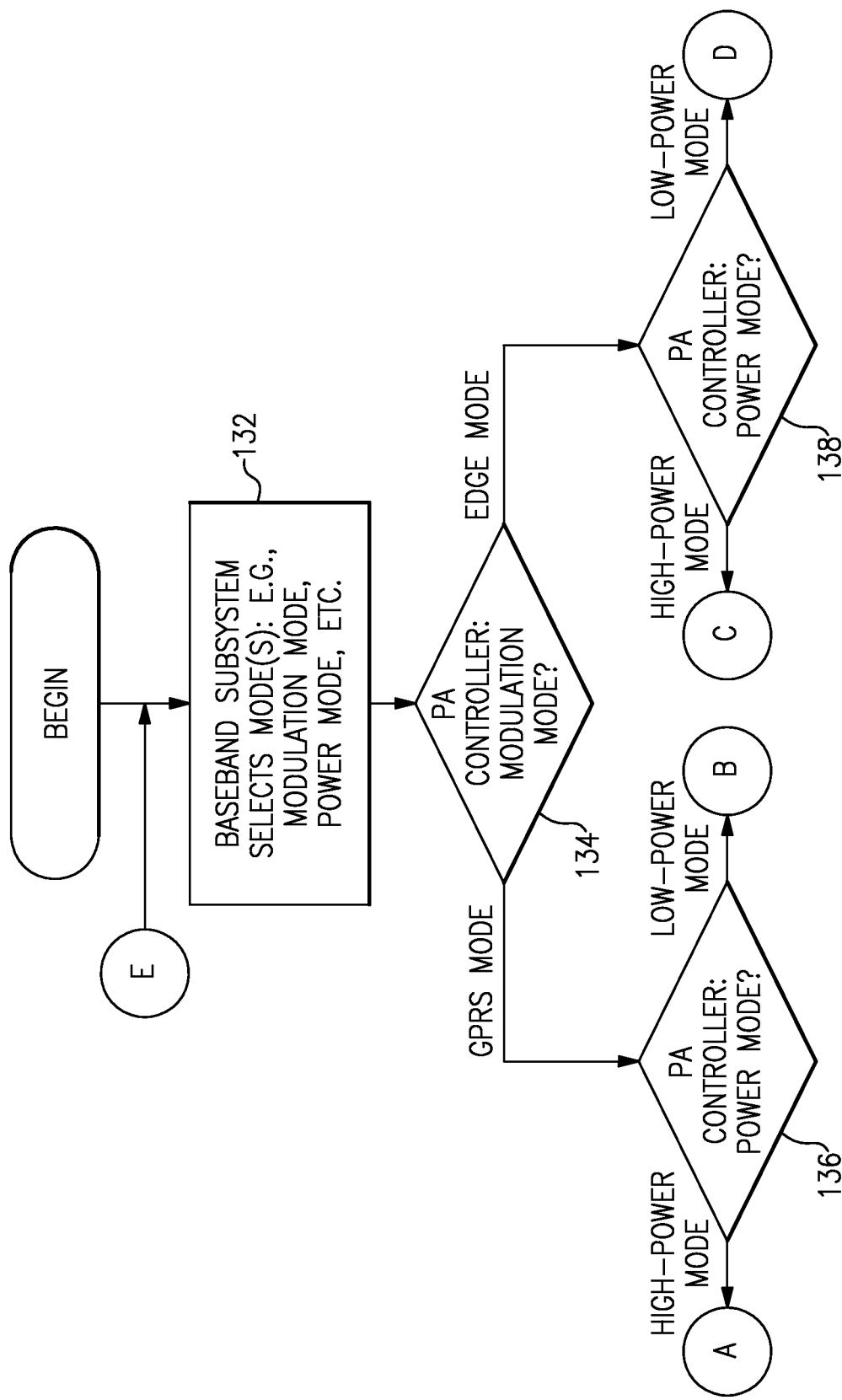
FIG. 8 is a flow diagram illustrating an exemplary method of operation of a mobile wireless telecommunication device in accordance with the invention.
Figure 8B:
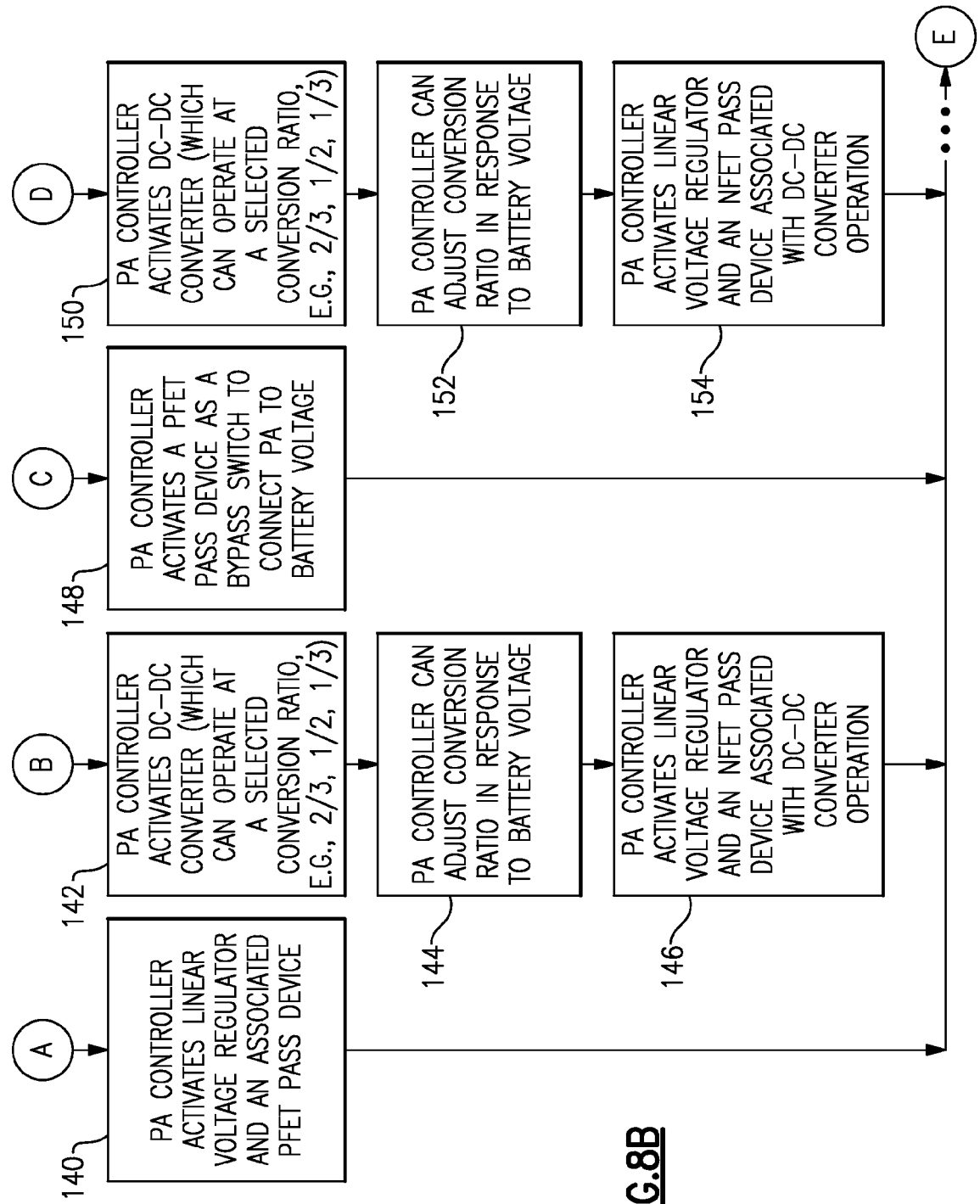

Operation of above-described system that controls power amplifier 32 (FIGS. 2-4) can be described in part with reference to the flow diagram of FIG. 8. As indicated by block 132, the system receives a mode signal indicating one of at least a first mode and a second mode. As described above, the mode signal can represent, for example, a selected one of an EDGE mode and a GPRS mode. In addition, the mode signal can represent a selected one of a high-power mode and a low-power mode (i.e., one of two transmission power levels, where one is higher than the other). Baseband subsystem 16 (FIG. 1) or another suitable element of the telecommunication device can perform the mode selection and generate the mode signal or signals. Power amplifier 32 amplifies an RF input signal in accordance with the mode signal, e.g., by amplifying the RF input signal at an amplification level or gain associated with the mode signal or other control signal. For example, power amplifier can amplify the RF input signal to a greater extent when the mode signal indicates a high-power mode than when the mode signal indicates a low-power mode.

As indicated by blocks 134, 136 and 138, in the exemplary embodiment the system determines whether the mode in which the transmitter is operating is: high-power EDGE, low-power EDGE, high-power GPRS, or low-power GPRS. It should be understood that these four modes are intended only to be exemplary, and in other embodiments there can be more or fewer modes. In other embodiments the modes can relate to modulation modes other than EDGE and GPRS (e.g., WCDMA) and can relate to operational characteristics or modes other than modulation modes and power level modes.

If it is determined that the mode is high-power EDGE, then as indicated by block 140 power amplifier controller 34 (FIGS. 2-4) activates a first regulator system that comprises a linear voltage regulator (based upon op-amp system 56) and a PFET pass device associated with the linear voltage regulator. In the high-power EDGE mode, the PFET pass device acts as a bypass switch such that it supplies to power amplifier 32 to approach the full power supply or battery voltage, thereby promoting maximum RF transmission power.

If it is determined that the mode is low-power EDGE, then as indicated by blocks 142 and 146 power amplifier controller 34 activates a second regulator system that comprises DC-DC converter 60 and an NFET pass device associated with DC-DC converter 60. Note that in the above-described high-power EDGE mode, power amplifier controller 34 can deactivate this second regulator system. In the low-power EDGE mode, DC-DC converter 60 reduces the voltage to a more efficient level below the battery voltage. In the low-power EDGE mode, the NFET pass device, which inherently provides better power supply noise rejection than a PFET pass device, promotes isolating power amplifier 32 from noise generated by DC-DC converter 60. The use of an NFET as a pass device in RF power amplifier power supply circuitry is conventionally not generally feasible absent a voltage doubler or other auxiliary circuitry because, unlike a PFET, an NFET would not operate properly unless its gate voltage could be made higher than the battery voltage. However, an NFET device can be employed in embodiments of the present invention as described above because the power amplifier collector voltage remains well below the battery voltage during operation, thus providing sufficient headroom to bias the NFET gate. Note that, as indicated by block 146, the linear voltage regulator can also be activated during the low-power EDGE mode, as the linear voltage regulator further promotes isolating power amplifier 32 from noise generated by DC-DC converter 60.

Block 142 indicates that in the exemplary embodiment power amplifier controller 34 not only activates DC-DC converter 60 but also can set or selects the conversion ratio at which DC-DC converter 60 is to operate, such as ⅔, ½ or ⅓ of the battery voltage. However, in other embodiments the conversion ratio can be fixed and not selectable. As indicated by block 144, power amplifier controller 34 can further set or select the conversion ratio in response to a measurement of battery voltage. For example, DC-DC converter 60 can be adjusted to raise the conversion ratio from ⅓ to ½, or from ½ to ⅔, if baseband subsystem 16 detects a decrease in battery voltage.

If it is determined that the mode is high-power GPRS, then as indicated by block 148 power amplifier controller 34 can activate neither the first regulator system nor the second regulator system but rather activate the PFET pass device alone, so as to connect power amplifier 32 directly to the battery voltage. Note that in the exemplary embodiment this PFET serves a dual function: as a pass device for the linear voltage regulator in the high-power GPRS mode and as a bypass switch in the high-power EDGE mode.

If it is determined that the mode is low-power GPRS, then the system can operate in accordance with blocks 150, 152 and 154, which are the same as blocks 142, 144 and 146, respectively, described above with regard to low-power EGDE mode. That is, in the exemplary embodiment the system operates in the same way in both low-power EDGE mode and low-power GPRS mode.

It should be noted that the system that controls power amplifier 32 not only controls the extent of amplification but also supplies regulated power to power amplifier 32. When the first regulator system is activated, power amplifier 32 is powered by the first regulator system. When the second regulator system is activated, power amplifier 32 is powered by the second regulator system. As indicated by the flow connections from blocks 140, 146, 148 and 154 returning to block 132, the above-described method of operation can occur periodically or at any suitable time, such as each time baseband subsystem 16 changes the mode of transmitter operation. The above-described method can be included as part of the overall method by which a mobile wireless telecommunication device operates (with such other device operation indicated by the ellipsis (". . .") before the flow returns to block 132). It should be understood that the operations described above are only attributed to blocks 132-154 for purposes of ease of reference in describing the exemplary embodiment, and the operations can be organized into any other suitable blocks, processes, etc. Furthermore, the operations can be performed in any other suitable order and at any other suitable time with respect to each other or other events in the overall operation of the mobile wireless telecommunication device. Some of the operations can be combined with other operations or omitted in some embodiments.

While various embodiments of the invention have been described, it will be apparent to those of ordinary skill in the art that many more embodiments and implementations are possible that are within the scope of this invention. Accordingly, the invention is not to be restricted except in light of the following claims.

What is claimed is:

1. A method for radio frequency (RF) power amplification, the method comprising:
   receiving a mode signal indicating one of a first mode and a second mode;
   operating an RF power amplifier in response to the mode signal and an RF input signal to be amplified, the power amplifier receiving power from an activated one of a first regulator system having a linear voltage regulator and a PFET pass device and a second regulator system having a DC-DC converter and an NFET pass device;
   activating the linear voltage regulator and the PFET pass device to supply power to the power amplifier while deactivating the DC-DC converter and the NFET pass device in response to a condition of the mode signal indicating the first mode; and
   activating the DC-DC converter and the NFET pass device to supply power to the power amplifier while deactivating the linear voltage regulator and the PFET pass device in response to a condition of the mode signal indicating the second mode.

2. The method of claim 1 wherein the mode signal further indicates one of the first mode, the second mode and a third mode.

3. The method of claim 2 further comprising activating the PFET pass device to supply power to the power amplifier directly from a power supply battery while deactivating both the linear voltage regulator and the DC-DC converter in response to a condition of the mode signal indicating the third mode.

4. The method of claim 3 wherein the third mode is a high-power mode associated with EDGE (Enhanced Data Rates for GSM Evolution) transmission.

5. The method of claim 1 wherein:
   the first mode is a high-power mode;
   the second mode is a low-power mode; and
   operating the power amplifier includes operating the power amplifier at a first amplification level in response to the condition of the mode signal indicating the high-power mode and operating the power amplifier at a second amplification level lower than the first amplification level in response to the condition of the mode signal indicating the low-power mode.

6. The method of claim 1 wherein the first mode is associated with GPRS (General Packet Radio Service) transmission.

7. The method of claim 1 wherein the second mode is associated with GPRS (General Packet Radio Service) transmission.

8. The method of claim 1 wherein the second mode is associated with EDGE (Enhanced Data Rates for GSM Evolution) transmission.

9. The method of claim 1 further comprising adjusting a conversion level of the DC-DC converter in response to a change in power supply battery voltage.

10. A radio frequency (RF) power amplification system, comprising:
    an RF power amplifier configured to receive an RF input signal to be amplified;
    a first regulator system having a linear voltage regulator and a P-channel field effect transistor (PFET), the linear voltage regulator configured to receive a feedback signal from the RF power amplifier and produce a regulated voltage signal;
    a second regulator system having a DC-DC converter and an N-channel field effect transistor (NFET), the DC-DC converter configured to receive a power supply voltage signal and produce a reduced voltage signal; and
    a control circuitry configured to receive a mode signal indicating one of a first mode and a second mode, the control circuitry further configured to activate the linear voltage regulator and the PFET pass device to supply power to the power amplifier while deactivating the DC-DC converter and the NFET pass device in response to a condition of the mode signal indicating the first mode, the control circuitry further configured to activate the DC-DC converter and the NFET pass device to supply power to the power amplifier while deactivating the linear voltage regulator and the PFET pass device in response to a condition of the mode signal indicating the second mode.

11. The system of claim 10 wherein the control circuitry is further configured to receive a mode signal indicating one of the first mode, the second mode, and a third mode, and in response to a condition of the mode signal indicating the third mode the control circuitry activates the PFET pass device to supply power to the power amplifier directly from a power supply battery while deactivating both the linear voltage regulator and the DC-DC converter.

12. The system of claim 10 wherein:
    the first mode is a high-power mode; and
    the second mode is a low-power mode, such that the control circuitry is configured to control operation of the RF power amplifier at a first amplification level in response to the condition of the mode signal indicating the high-power mode and controls operation of the RF power amplifier at a second amplification level lower than the first amplification level in response to the condition of the mode signal indicating the low-power mode.

13. The system of claim 10 wherein:
    the control circuitry provides a PFET control signal to a gate of the PFET pass device to control the PFET pass device; and
    the control circuitry produces a NFET control signal to a gate of the NFET pass device to control the NFET pass device.

14. The system of claim 10 wherein:
    an output of the PFET pass device and an output of the NFET pass device are coupled together at a collector of an output stage transistor of the RF power amplifier; and
    the feedback signal received by the linear voltage regulator from the RF power amplifier is a function of the collector voltage.

15. The system of claim 10 wherein:
    the linear voltage regulator includes a first folded-cascode transistor group and a second folded-cascode transistor group, the first folded-cascode transistor group having a first cascode pair of transistors and a second cascode pair of transistors, the second folded-cascode transistor group having a third cascode pair of transistors and a fourth cascode pair of transistors;

the control circuitry is configured to control, in response to the mode signal, switching of a first bias voltage to either the first cascode pair or the third cascode pair and switching of a second bias voltage to either the second cascode pair or the fourth cascode pair;

the PFET control signal includes an output of the first folded-cascode transistor group; and the NFET control signal includes an output of the second folded-cascode transistor group.

16. The system of claim 10 further comprising:

a current sensing circuit;

a current sensing PFET coupled to the PFET pass device and configured to provide a signal representing current in the PFET pass device to the current sensing circuit; and a current sensing NFET coupled to the NFET pass device and configured to provide a signal representing current in the NFET pass device to the current sensing circuit.

17. The system of claim 10 further comprising another RF power amplifier, the another RF power amplifier coupled to an output of the DC-DC converter to provide a control signal to the RF power amplifier, the another RF power amplifier configured to receive another RF input signal to be amplified and producing an output signal in response to the another RF input signal and the control signal.

18. A radio frequency (RF) power amplification system, comprising:

an RF power amplifier having an output stage transistor and configured to receive an RF input signal to be amplified;

a first regulator system having a linear voltage regulator and a P-channel field effect transistor (PFET), the linear voltage regulator configured to receive a feedback signal from the RF power amplifier and produce a regulated voltage signal, the feedback signal received by the linear voltage regulator from the RF power amplifier being a function of a collector voltage of the output stage transistor of the RF power amplifier;

a second regulator system having a DC-DC converter and an N-channel field effect transistor (NFET), the DC-DC converter configured to receive a power supply voltage signal and produce a reduced voltage signal, an output of the PFET pass device and an output of the NFET pass device being coupled together at a collector of the output stage transistor of the RF power amplifier and a control circuitry configured to receive a mode signal indicating one of a first high-power mode, a low-power mode, and a second high-power mode, the control circuitry configured to control operation of the RF power amplifier at a higher amplification level in response to the condition of the mode signal indicating one of the first high-power mode the second high-power mode and control operation of the RF power amplifier at a second amplification level lower than the first amplification level in response to the condition of the mode signal indicating the low-power mode, the control circuitry further configured to activate the linear voltage regulator and the PFET pass device to supply power to the power amplifier while deactivating the DC-DC converter and the NFET pass device in response to a condition of the mode signal indicating the first high-power mode, the control circuitry further configured to activate the DC-DC converter and the NFET pass device to supply power to the power amplifier while deactivating the linear voltage regulator and the PFET pass device in response to a condition of the mode signal indicating the low-power mode, the control circuitry further configured to activate the PFET pass device to supply power to the power amplifier directly from a power supply battery while deactivating both the linear voltage regulator and the DC-DC converter in response to a condition of the mode signal indicating the second high-power mode.

19. The system of claim 18 wherein:

the linear voltage regulator includes a first folded-cascode transistor group and a second folded-cascode transistor group, the first folded-cascode transistor group having a first cascode pair of transistors and a second cascode pair of transistors, the second folded-cascode transistor group having a third cascode pair of transistors and a fourth cascode pair of transistors;

the control circuitry is configured to control, in response to the mode signal, switching of a first bias voltage to either the first cascode pair or the third cascode pair and switching of a second bias voltage to either the second cascode pair or the fourth cascode pair;

the PFET control signal includes an output of the first folded-cascode transistor group; and the NFET control signal includes an output of the second folded-cascode transistor group.

20. The system of claim 19 further comprising:

a current sensing circuit;

a current sensing PFET coupled to the PFET pass device and configured to provide a signal representing current in the PFET pass device to the current sensing circuit; and a current sensing NFET coupled to the NFET pass device and configured to provide a signal representing current in the NFET pass device to the current sensing circuit.

21. The system of claim 19 further comprising another RF power amplifier, the another RF power amplifier coupled to an output of the DC-DC converter to provide a control signal to the RF power amplifier, the another RF power amplifier configured to receive another RF input signal to be amplified and produce an output signal in response to the another RF input signal and the control signal.

22. A radio frequency (RF) power amplification system, comprising:

a power amplifier capable of operating in a high-power mode or a low-power mode, the power amplifier including one or more transistors and configured to receive a collector voltage for the one or more transistors; and a regulator circuit including a first pass device having a PFET and being configured to yield a high-voltage signal for the power amplifier in the high-power mode, the regulator circuit further including a second pass device having an NFET and being configured to yield a low-voltage signal for the power amplifier in the low-power mode, the collector voltage set at a value sufficiently below a battery voltage to provide sufficient headroom to bias the gate of the NFET.

23. A wireless device comprising:

a transmit circuit configured to generate a radio-frequency (RF) signal;

a power amplifier configured to amplify the RF signal in a high-power mode or a low-power mode, the power amplifier including one or more transistors and configured to receive a collector voltage for the one or more transistors;

a regulator circuit coupled to the power amplifier, the regulator circuit including a first pass device having a PFET and being configured to yield a high-voltage signal for the power amplifier in the high-power mode, the regulator circuit further including a second pass device having an NFET and being configured to yield a low-voltage signal for the power amplifier in the low-power mode, the collector voltage set at a value sufficiently below a battery voltage to provide sufficient headroom to bias the gate of the NFET; and an antenna configured to facilitate transmission of the amplified RF signal.

\* \* \* \* \*

UNITED STATES PATENT AND TRADEMARK OFFICE
CERTIFICATE OF CORRECTION

| | | |
|---|---|---|
| PATENT NO. | : 8,774,739 B2 | Page 1 of 1 |
| APPLICATION NO. | : 13/571291 | |
| DATED | : July 8, 2014 | |
| INVENTOR(S) | : David Steven Ripley | |

It is certified that error appears in the above-identified patent and that said Letters Patent is hereby corrected as shown below:

In the Claims

Column 11 line 47, Claim 18, Change "amplifier" to --amplifier;--.

Signed and Sealed this
Seventeenth Day of February, 2015

Michelle K. Lee
*Deputy Director of the United States Patent and Trademark Office*